United States Patent [19]
Bollens et al.

[11] Patent Number: 5,888,372
[45] Date of Patent: Mar. 30, 1999

[54] PROCESS FOR PRODUCING METAL-COATED FILMS IN WEB FORM

[75] Inventors: Louis Bollens, Begijnendijk; André Heyvaerts, Hemiksen; Dirk Quintens, Lier, all of Belgium; Gerhard Dieter Wolf, Dormagen, Germany; Henning Giesecke, Köln, Germany; Friedrich Jonas, Aachen, Germany

[73] Assignee: Bayer Aktiengesellschaft, Leverkusen, Germany

[21] Appl. No.: 873,531

[22] Filed: Jun. 12, 1997

[30] Foreign Application Priority Data

Jun. 17, 1996 [DE] Germany .................... 196 24 071.9

[51] Int. Cl.⁶ .................. C25D 5/54; C25D 5/56; C25D 5/34; C23C 28/02
[52] U.S. Cl. .................. 205/159; 205/161; 205/164; 205/167; 205/169; 205/187; 205/210
[58] Field of Search ................... 205/159, 161, 205/164, 167, 169, 187, 210

[56] References Cited

U.S. PATENT DOCUMENTS

| | | | |
|---|---|---|---|
| 4,575,467 | 3/1986 | Sirinyan et al. | 427/304 |
| 4,910,045 | 3/1990 | Giesecke et al. | 427/98 |
| 5,182,135 | 1/1993 | Giesecke et al. | 427/98 |
| 5,648,125 | 7/1997 | Cane | 427/534 |

FOREIGN PATENT DOCUMENTS

| | | |
|---|---|---|
| 0034485 | 8/1981 | European Pat. Off. . |
| 0081438 | 6/1983 | European Pat. Off. . |
| 0131195 | 1/1985 | European Pat. Off. . |
| 0256395 | 2/1988 | European Pat. Off. . |
| 0322641 | 7/1989 | European Pat. Off. . |
| 0329406 | 8/1989 | European Pat. Off. . |
| 0419845 | 4/1991 | European Pat. Off. . |
| 419845 | 4/1991 | European Pat. Off. . |

*Primary Examiner*—Kathryn Gorgos
*Assistant Examiner*—Edna Wong
*Attorney, Agent, or Firm*—Sprung Kramer Schaefer & Briscoe

[57] ABSTRACT

A metal-coated film can be produced continuously from a non-conducting film by successive electroless and galvanic metallization in such a way that a film of this kind is subjected, in a continuous "roll-to-roll" process, to the following operations:

a) applying a metallizable primer,
b) drying the applied primer,
c) conditioning the applied primer,
d) optionally activating the applied primer,
e) treatment with an electroless chemical metallizing bath,
f) optional treatment with a first rinsing liquid,
g) treatment with a galvanic metallizing bath,
h) treatment with a second rinsing liquid, and
i) optional heat treatment of the metallized film.

1 Claim, No Drawings

PROCESS FOR PRODUCING METAL-COATED FILMS IN WEB FORM

BACKGROUND OF THE INVENTION

1. Field of the Invention

The invention relates to the production of metal-coated films in a continuous "roll-to-roll" process. The metal-coated films produced in accordance with the invention are distinguished, in relation to other known metal-coated films which can likewise be produced continuously, by two advantages: firstly, they do not include the commonly employed adhesive interlayers between film and metal coat, and, secondly, they can have very thin metal coats of down to 2–8 $\mu$m. On the basis of these dual advantages, the films produced in accordance with the invention can be used with particular advantage to produce miniaturized ultrafine conductor circuits and also 2-layer circuits and multilayers.

2. Description of the Related Art

Polyester and polyimide films with copper foils laminated atop them are known and are produced in large quantities for the production of flexible circuits and of film connectors (Jürgen Bednarz, Kunststoffe in der Elektrotechnik und Elektronik [Plastics in electrical engineering and electronics], Verlag W. Kohlhammer, 1988, p. 224 ff.). However, these laminates generally include an adhesive interlayer, which is typically from 25 to 50 $\mu$m thick and consists, for example, of an epoxy resin or an acrylate adhesive. Moreover, the copper foils used must be of a certain minimum thickness in order to safeguard mechanical handling. In many cases copper foils 18 $\mu$m, 35 $\mu$m or 70 $\mu$m thick are employed. There are also thinner copper foils on the market, for example those with a thickness of 9 $\mu$m, whose use might also be considered. Such thin foils additionally possess, however, a treatment which is up to 9 $\mu$m thick, and therefore require etching times whose duration is similar to that for the common, thicker copper foils. Owing to the interlayer of adhesive and the fairly high copper layer thicknesses, the production of 2-layer circuits is difficult and costly, and the production of ultrafine conductor circuits is, accordingly, limited in terms of the width of the individual conductor tracks. The adhesive, moreover, becomes smeared in the course of drilling and has to be "etched back" prior to through-hole plating. In addition the adhesive is sensitive to a variety of organic solvents which might act on circuit boards produced in this way. The omission of an adhesive interlayer would have the advantage that the product could be made even thinner and, in particular, it would be possible in the case of multilayer circuit boards to avoid the currently very great expansion of multilayers in the interlayer. It is therefore a concern of the present invention to avoid such disadvantages.

Another composite material which has become known, comprising copper foil/plastic, is produced by taking the known 18 $\mu$m or 35 $\mu$m thick copper foils already mentioned above and generating thereon a polyimide layer, by pouring on and drying a solution of a soluble polyimide. These products are produced and marketed, for example, under the designation ESPANEX® by Rogers, USA. Similar products are manufactured by Nippon Steel Chemical Co., Ltd. Relative to the polyimide film/copper foil laminates mentioned further above, products of this kind have the great advantage of containing no interlayer of adhesive. Nevertheless, they are still based only on the 18 or 35 $\mu$m thick copper foils, whose mechanical handling properties are still good, and are therefore less well suited to the production of ultrafine conductor circuits.

A further metal-coated film, bearing the designation NOVOCLAD® from Sheldal, USA, consists of a polyimide film to which copper has been applied by sputtering. This product possesses the advantage of a very thin copper layer, in the context of the production of ultrafine circuit boards, however, the adhesion of the copper layer is rather low.

EP 256 395 (equivalent to U.S. Pat. No. 5,182,135) and EP 322 641 (equivalent to U.S. Pat. No. 4,910,045) describe processes for the firmly adhering deposition of metal coats atop polymer surfaces, for example plastics films. For this purpose, metallizable primers in the form of binder-containing activator formulations are applied to plastics substrates, and, after drying at elevated temperatures, are provided in chemical metallizing baths with a firmly adhering metal coat. These processes are extremely well suited to the discontinuous production of flexible circuits and ultrafine conductor circuits; however, they are unsuitable for a continuous process, for the following reasons. For the production of special flexible circuits it is true that the deposition of a copper layer having a thickness of 2 $\mu$m is sufficient. In order, however, to deposit such a copper layer of 2 $\mu$m, a residence time in a chemical copper bath of about 1 hour is necessary. Such long residence times makes it impossible to transfer the technique to a continuous process, since it would be necessary to have either a much too low rate of passage through the metallizing bath or else far too great spatial dimensions of this bath.

SUMMARY OF THE INVENTION

It has now been found that films can be coated continuously with metal if metallizable primers in the form of binder-containing activator formulations, as described in the abovementioned documents EP' 395 and EP' 641 are used but metallization is carried out in two stages. In such a process, the first stage comprises an "initial metallization" in an electroless chemical metal bath, until a coherent metal layer of sufficiently good conductivity has formed, followed in a second stage by galvanic continuing metallization, i.e. metallization with the aid of electric current, with substantially higher metal deposition rates. The invention, therefore, is based on the new finding that in a continuously operating procedure the slow process of electroless chemical metallization need only take place to an extent small enough to form a sufficiently conductive metal layer, which forms the basis for the subsequent galvanic metallization. In particular, specific metallizable primers are suitable for this novel 2-stage process.

The films which have been metal-coated in accordance with the invention do not possess the disadvantages described above. Thus they do not possess interlayers of adhesive and have only very thin metal coats, and the metal adhesion is excellent, even after solder bath treatments, for example. Consequently, the films metal-coated in accordance with the invention are outstandingly suited to the production of single- and double-sided circuits and of multilayer circuits of a wide variety of types and of sensors, but especially to the production of ultrafine conductor circuits, in which context their high flexibility is a particular advantage.

The invention accordingly provides a continuous process for producing a metal-coated film from a non-conducting film, by successive electroless and galvanic metallization, which comprises subjecting the non-conducting film in a continuous roll-to-roll process to the following operations:

a) applying a metallizable primer, b) drying the applied primer, c) conditioning the applied primer, d) optionally activating the applied primer, e) treatment with an electroless chemical metallizing bath, f) optional treatment with a first rinsing liquid, g) treatment with a galvanic metallizing bath, h) treatment with a second rinsing liquid, and i) optional heat treatment of the metallized film.

DETAILED DESCRIPTION OF THE INVENTION

Examples of suitable non-conducting materials for the films that are to be coated are polyethylene terephthalate, polybutylene terephthalate, polyethylene naphthate, polypropylene, polycarbonate, ABS, polyetherimide, polysulfone, polyether sulfone, polyimides, polyamideimides, aromatic polyamides with or without heterocycles, such as polyhydantoin, and blends of these polymers. It is also possible to employ nonwovens comprising fibers of the abovementioned polymers.

The preparation of these materials and their processing to form machine-compatible films in web form is known. For example, films with thicknesses from 12 to 125 $\mu$m, preferably from 50 to 100 $\mu$m, are employed in accordance with the invention.

Metallizable primers for the novel process are already known from processes for the discontinuous production of circuit boards. They comprise compounds of metals which are suitable as activators for the electroless chemical metal deposition; these metals are, in general, the (semi)noble metals of groups IB and VIIIB of the Periodic Table of the Elements (Mendeleyev). In addition, such primers comprise an organic polymeric binder which is soluble in organic solvents or dispersible in water-containing formulations. In addition, such primers comprise solvents including water and may additionally comprise fillers and customary additives, such as colorants, surfactants, leveling agents, deaerating agents, thickeners and other rheological additives, etc.

Preferably, metallizable primers are employed whose essential constituents are i) from 0.03 to 2.5% by weight of a (semi)noble metal compound as activator, ii) from 3 to 20% by weight of an organic polymeric binder, iii) from 1 to 20% by weight of one or more fillers, and iv) from 57.5 to 95.97% by weight of a halogen-free solvent or solvent mixture having a flash point above 21° C. and a boiling point of at least 80° C., all percentages being based on the total weight of the primer, and it being possible for the primer additionally to comprise customary additives such as colorants, surfactants and leveling agents.

The constituent i) is an inorganic or organic salt, a complex salt or an organometallic compound of the (semi) noble metals Cu, Ag, Au, Ru, Pd or Pt, preferably of Ag or Pd, as activator.

Activators in the form of the abovementioned compounds of (semi)noble metals of subgroups IB and VIIIB are described, for example, in EP 34 485, EP 81 438 and EP 131 195. Examples of organometallic compounds among these are those of Pd, but also of other (semi)noble metals, with olefins, dienes, α,β-unsaturated carbonyl compounds, with crown ethers and with nitrites. Examples of compounds which can be employed advantageously are butadiene-palladium dichloride, bisacetonitrile-palladium dichloride, bisbenzonitrile-palladium dichloride, 4-cyclohexene-1,2-dicarboxylic anhydride-palladium dichloride, mesityl oxide-palladium dichloride, 3-hepten-2-one-palladium dichloride and 5-methyl-2-hexen-2-one-palladium dichloride, without this listing being exhaustive. It is of course also possible to employ mixtures of such compounds. They can be present dispersed or in solution in the primer formulations. In this context, a solution can also be prepared by adding solubilizers, for example quaternary ammonium salts such as tetrabutylammonium bromide. In the case of dispersion of the activators it is advantageous to achieve particle sizes of below 1 $\mu$m.

A suitable organic polymeric binder in the primer to be employed in accordance with the invention is an aliphatic, aromatic or aliphatic-aromatic polyimide, polyamideimide, polyurethane, polyacrylate or epoxy resin. Polyimides or polyamideimides, or polyurethanes, are preferably employed. It is, however, also possible to use aqueous binder dispersions, based for example on acrylate, polyurethane or polyester, and polyolefin dispersions, and also mixtures of such dispersions.

The term polyimides is understood as referring equally to their variants, such as polyamideimides, polyesterimides and polyetherimides, and also their co-condensates and mixtures. The preparation is familiar to the skilled worker and takes place, for example, by condensation of (cyclic) polycarboxylic anhydrides, polycarboxylic acid-carboxylic anhydrides, polycarboxylic acids or their esters with polyamines, polyamides, polyisocyanates or polycarbamic esters. Polyimides of the type mentioned can be employed as polymeric or as oligomeric imides or polyamide acids, which are condensed out again following application. Use is preferably made of aliphatic-aromatic polyamideimides as are obtained, for example, by condensing trimellitic anhydride with polyisocyanate and lactams or polyamides (U.S. Pat. No. 4,549,006; U.S. Pat. No. 4,628,079). Of advantage, for example, are polyamideimides that are obtained from trimellitic anhydride, caprolactam and 4,4'-diisocyanato-diphenylmethane or from blends of 4,4'-diisocyanato-diphenyl-methane and technical-grade mixtures of 2,4- and 2,6-tolylene diisocyanate (U.S. Pat. No. 4,546,162).

Polyurethanes that can be employed in accordance with the invention are familiar from polyurethane chemistry. They are prepared, for example, by reacting isocyanates with polyols which can in turn be esters and/or ethers having terminal hydroxyl groups. For preparing storage-stable formulations it is advantageous, furthermore, to employ polyurethanes that no longer contain any free isocyanate groups. Examples of compounds that have proven suitable are linear aromatic polyurethane elastomers as are prepared, for example, from butanediol polyadipate, neopentylglycol and 4,4'-diphenyl-methane diisocyanate. To increase the bond strength of the novel primer formulations on the surfaces it may also be advantageous to add polyisocyanates, or oligo- or polyurethanes containing free isocyanate groups, to the binders. Additives which have proven to be particularly favorable in this context are those containing free isocyanate groups attached to aliphatic chains. Examples of suitable polyurethanes are biuret polyisocyanates based on 1,6-diisocyanato-hexane, polyisocyanates that contain isocyanate groups and are based on 1-isocyanato-3,3,5-trimethyl-5-isocyanatomethyl-cyclohexane, and polyisocyanates that contain isocyanurate groups and are based on mixtures of 1,6-diisocyanato-hexane and 1-isocyanato-3,3,5-tri methyl-5-isocyanato-methyl-cyclohexane, polyisocyanates containing biuret groups, as are obtainable, for example, in accordance with U.S. Pat. No. 4,264,519; organic polyisocyanates containing uretdione groups and isocyanurate groups, as are obtained, for example, in accordance with EP 173 252. When polyurethanes having free aromatic isocyanate groups are used it may be favorable on grounds of storage stability to subject the free isocyanate groups to reversible blocking in a known manner. Techniques of this kind are known from polyurethane chemistry. Examples of blocking agents which can be employed are phenols, caprolactam, β-dicarbonyl compounds, such as acetoacetates and malonates, certain alcohols, oximes and triazoles.

The primer formulations which can be employed in accordance with the invention may additionally comprise customary additives, such as colorants, surfactants. leveling agents, etc.

Halogen-free solvents having a flashpoint above 21° C. and a boiling point of at least 80° C. for the novel primer formulations are the substances known in printing or coating technology, from the group of aromatic and aliphatic hydrocarbons, mono- or polyhydric alcohols with 2 to 8 C-atoms, $C_3$–$C_8$-ketones, ester of aliphatic alcohols and of glycol ethers with aliphatic and aromatic carboxylic acids with 3–12 C-atoms, glycol ethers with 3–12 C-atoms, open-chain and cyclic carboxylic acid amides with alkylated N-atoms with 3–22 C-atoms, lactones with 4–7 C-atoms, diacetone alcohol and water, such as for example toluene, xylene, benzene, petroleum ether; butanol, glycol, glycerol; acetone, methyl ethyl ketone, cyclohexanone, methyl isobutyl ketone; butyl acetate, dioctyl phthalate, butyl glycolate; ethylene glycol monomethyl ether, diglyme, propylene glycol monomethyl ether; ethylene glycol acetate, propylene glycol monomethyl ether acetate; diacetone alcohol, and water. It is of course also possible to employ mixtures of these solvents and their blends with other solvents. When using polyimides or polyamideimides or precursors thereof, particularly advantageous solvents are those which dissolve or swell these polymers. Examples which may be mentioned, therefore, are the following additional solvents: dimethylformamide (DMF), N-alkyl-pyrrolidone with alkyl radicals from —$CH_3$ to —$C_{18}H_{37}$, preferably N-methyl-pyrrolidone (NMP), butyrolactone, N-methyl-caprolactam (NMC), dimethylacetamide (DMAc) and hexamethylphosphoramide. These latter solvents can also be employed as mere additives, together with other solvents.

Suitable fillers are the auxiliaries known from printing and coating technology, such as pigments, disperse silicic acids, clay minerals, carbon blacks and rheological additives. Examples are AEROSIL® colloidal silica, $TiO_2$, talc, iron oxides, kieselguhr, heavy spar, kaolins, quartz flour, smectites, coloring blacks, graphites, zinc sulfides, chromium yellow, bronzes, organic pigments and chalk. Preference is given to Aerosils, heavy spa and $TiO_2$. Mixtures of the fillers are of course also suitable for use.

The primer formulations which can be employed in accordance with the invention are generally prepared by mixing the constituents. Apparatus suitable for this includes not only the simple stirrers but also, in particular, the wet-comminution units which are customary in coating and printing technology, such as compounders, attritors, roll mills, dissolvers, rotor-stator mills, ball mills and stirred mills. The primer constituents can of course also be incorporated in separate steps. For example, it is possible first of all to disperse or dissolve the activator in the binders and solvents and only then to incorporate the fillers. Another conceivable process variant consists in first pasting up the fillers in the solvents under high shear forces.

The application of the metallizable primer in operation a) takes place by curtain coating, knife coating, printing, coating by means of applicator rolls, spraying, or by passing the film through a primer bath. In the case of curtain coating, very smooth layers in comparison, for example, with screen printing are obtained, which are particularly desirable for the production of ultrafine conductor circuits. Thus, for example, the roughness $R_{max}$ of a KAPTON® film (KAPTON®=polyimide) is 1.62 μm, the roughness of a dried primer layer after application by screen printing is 2.51 μm and the roughness of a dried primer layer after curtain coating is 2.11 μm. Subsequently, operation b) of drying the applied primer is carried out. In this operation b), the thickness of the applied primer layer reduces as a result of the loss of solvent. The originally applied solvent-containing primer is therefore applied in a layer thickness such that after the drying step a dry primer layer of from 0.5 to 10 μm, preferably from 1 to 5 μm, remains on the film. In this context the primer can be applied to the whole area of the film or else in the form of patterns, for example in the form of conductor tracks. For the latter process variant, whole-area application is replaced by printed application in accordance with various printing techniques. It is obvious that different viscosities of the primer formulation to be applied are chosen for the specific forms of application mentioned; for instance, application by printing requires a paste of higher viscosity than in the case of application by pouring, spraying or the passing of the film through a bath of the primer formulation. The viscosity is generally established by way of the amount of solvent. Accordingly, the reduction in layer thickness of the applied primer layer in the course of drying varies in extent. It is of course also possible, in accordance with the invention, to apply thicker layers of primer than those mentioned; however, the sense of the invention is to establish layer thicknesses which are as low as possible in order to achieve metallized films of maximum flexibility.

For the drying of the coated films, they are preferably passed through a drying tunnel where they are dried with hot air or are at least partially dried to such an extent that they can be wound up on a reel. However, drying can just as well be carried out by IR irradiation. In the context of the invention, the film in web form is treated continuously for application of the primer and for (partial) drying, i.e. is unwound from a reel, subjected to operations a) and b), and wound up again onto another reel. The web length of the film on a reel can be variable, as known to the skilled worker; however, the web length is arbitrary, so as to give a continuous procedure.

The coated and (partially) dried film is then ready in principle for electroless chemical metallization. Preferably, however, conditioning of the primer applied atop the film is carried out as operation c). The conditioning is a further heat treatment, but at a higher temperature than the previous drying. Whereas drying is (generally carried out at a film temperature of from 80° to 110° C., conditioning is conducted at a temperature of from 120° C. up to a temperature of from 10° to 30° C. below the thermal stability limit of the film. For example, a coated polyimide film can be conditioned by carrying out a treatment in a convection drying tunnel at temperatures in the range from 230° to 350° C., preferably from 250° to 320° C., for one hour, for instance. The conditioning can also be effected by contact heating, however, by passing the film over a heated roller at a roller temperature of from 250° to 450° C., preferably from 375° to 425° C., for a period of from 0.5 to 5 minutes, preferably from 1 to 4 minutes. Finally, conditioning can, like drying, also be effected by heating with IR radiators. This is done using treatment times and temperatures as for contact heating. Heating with IR rays is preferably done from the reverse side, i.e. on the uncoated side. In the case that the film to be metallized consists of polyester having, compared with polyimide, a lower thermal stability limit, temperatures in the range from 130° to 200° C. are employed. In the case that, even with polyester films, contact heating or IR irradiation are employed, the temperatures involved are from 150° to 200° C. for a residence time of from 0.5 to 5 minutes. Finally, conditioning as operation c) can also take place in a drying oven, with the film remaining wound on the reel. The abovementioned operations can in principle be carried out such that the uncoated film is unwound from a reel and is passed through operations a) and b) and, alternatively to the procedure described above, is then passed further through operation c) and is supplied directly to the further novel operations without being wound up again. Since, however, the individual operations require varying residence times, it is advantageous, after the drying operation b), first of all to roll up the unwound film again, as set out above, in its now coated and (partially) dried form. This re-rolled coated film can then either be conditioned in a convection drying oven for one hour under the stated conditions (operation c)) or can be unwound again, passed through a drying tunnel or through IR irradiation or through contact heating, moved on continuously via a roller, and can be supplied to the following operations. An interruption of this kind after operation b) is preferred in order to take account of the varying residence times.

After the conditioning c), the coated films are passed continuously through an electroless chemical metallizing bath as operation e). The residence time in such a metallizing bath is set such that a coherent metal coat of sufficient conductivity for the subsequent galvanic metallization is formed. Metallizing baths for the novel process are aqueous solutions of compounds of the metals that are to be deposited and/or their alloys, for example of Cu, Ni, Fe, Co, Pd et cetera, preferably of Cu or Ni. The metallizing baths additionally comprise a reducing agent, such as formaldehyde, hydrazine or aminoboranes. These reducing agents sensitize the activator that is present in the primer and then reduce the metal that is to be deposited. Metallizing baths which can be used for the novel process are known and commercially customary. However, it is possible to perform separate activation/sensitization of the deposited primer in a separate bath, as operation d), prior to electroless chemical metal deposition and before entry into the actual metallizing bath; activation/sensitization of this kind is familiar to the skilled worker.

Electroless chemical metallization is carried out at temperatures from 20° to 80° C., preferably 25° to 70° C., particularly preferably 30° to 50° C. The residence time of the primer-coated film in the chemical electroless metallizing bath is from 3 to 30 minutes, preferably from 5 to 20 minutes. In a familiar way these residence times are dependent on the temperature of the electroless chemical metal deposition and on the desired thickness for a coherent, sufficiently conductive metal coat. At a residence time below 4 minutes, the resulting metal coat is generally not sufficiently conductive, and in addition is generally inadequately anchored within the primer layer. The thickness of the electrolessly deposited metal coat, from an economic and technical standpoint, is in the range from 0.1 to 3 $\mu$m, preferably from 0.2 to 1 $\mu$m. Of course, at longer residence times, it is also possible to obtain coat thicknesses of up to 5 $\mu$m or more.

Electroless chemical metallization is followed by a simple rinsing operation, generally with deionized water as a first rinsing liquid (operation f)).

The stage of electroless chemical "initial metallization" is followed by operation g), namely the treatment of the "initially metallized" film in a galvanic metallizing bath. Here, it is preferred to carry on working from operation e), with or without the interposition of operation f), in a "wet-on-wet" variant. It is of course also possible to carry out drying in between, which can be done without interrupting the continuous process, for example in a drying tunnel. Yet another variant consists in breaking off the continuous process after operation f), likewise in a manner as was described above after the end of operation b), by winding up the film treated so far (i.e. after electroless chemical metallization and optionally after the treatment with a rinsing liquid) and reintroducing the resulting roll into the continuous process. These interruptions can, as already described above, be used to deal with different residence times in individual operations.

The implementation of operation g), the treatment with a galvanic metallizing bath, takes place in a customary commercial and known metallizing bath from which one of the metals mentioned above for the electroless metallization, and of those preferably Cu or Ni, is deposited. To this end the film is connected as cathode in a direct-current circuit, for example by attaching wipers for current transfer to the metal coat of the film.

Regarding the thickness of this galvanically applied metal coat mention may be made, for example, of the range from 1 to 40 $\mu$m, preferably from 2 to 10 $\mu$m and, with particular preference, from 2 to 5 $\mu$m. Galvanic deposition is carried out using current densities of from 0.2 to 3 A/dm$^2$.

Within the context of galvanic metallization it is also possible to apply two or more metal coats in succession, by passing the "initially metallized" film through two or more identical or different galvanic metallizing baths. In this case, the current density in a first segment of galvanic metallization is preferably established within the lower part of the total range, for instance at from 0.2 to 1.8 A/dm$^2$, whereas in a second segment or in further segments it is carried out at higher current densities, for instance at from 1.0 to 3.0 A/dm$^2$, so that an increase by from 0.8 to 1.5 A/dm$^2$ is realized from segment to segment. In view of the subsequent use of the metallized film it is advisable to apply a corrosion-resistant layer as the final metal coat. For many cases, nickel is sufficiently corrosion-resistant and is therefore applied advantageously as the topmost metal coat. However, it is also possible to apply Sn, Pb, Pd or Au as topmost coat, or the coat sequence Ni/Au.

A further variant of the novel process consists in the preparation of double-sided metallized films, where the second side of the film is charged, simultaneously or in succession, with metallizable primer and conditioned. The metallization of such double-sided primer layers is carried out either in an electroless chemical metallizing bath or in one or more galvanic metallizing baths, preferably simultaneously. It is of course possible to take a film which has been electrolessly and galvanically metallized on one side in accordance with the invention and, in a further passage through the abovementioned operations, to metallize it on the other side in the manner of the invention.

Following galvanic metallization, rinsing is again preferably carried out, for example again with deionized water as the second rinsing liquid (operation h)).

The metallized film, which is then in principle finished, can also be subjected to heat treatment at from 80° to 250° C., preferably from 100° to 150° C. The overall coat thickness of the electrolessly and galvanically applied metal coat comprising one or more metals is from 0.1 to 70 $\mu$m, preferably from 2 to 12 µm and, with particular preference, from 2 to 8 µm, the region of low coat thicknesses being the more industrially advantageous in the context of the production of ultrafine conductor circuits.

The films metallized in the manner described are suited with particular advantage to the production of single- and double-sided flexible circuits with or without through-plating, for which purpose conductor tracks are formed, after the metallizing, by means of controlled etching. It is likewise possible to produce membrane keyboards, film connectors and sensors, for instance for securing articles of value against theft, of various kinds. Production can be carried out by a variety of patterning techniques common in circuit-board technology. The particular advantages of the films produced in accordance with the invention are that they contain none of the interlayers of adhesive which have been common to date and that, as a basis for the construction of conductor tracks, they have only very thin metal coats of the abovementioned thicknesses. In this way the production of circuits with particularly fine patterns is promoted, or indeed made possible. The attachment of chips to films in the micro bonding technique is a further possible use of the films produced in accordance with the invention.

EXAMPLES

Example 1

A nonreactive polyurethane elastomer was prepared from butanediol polyadipate (MW 2000), neopentylglycol and 4,4'-diphenylmethane diisocyanate. 110 parts by weight of this polyurethane elastomer were dissolved in 478 parts by weight of methoxypropyl acetate and 350 parts by weight of diethylene glycol monomethyl ether, 60 parts by weight of Aerosil 380 and 2 parts by weight of 3-hepten-2-one-palladium dichloride were added, and the constituents were carefully mixed with one another on a triple roll mill.

This primer formulation was knife-coated onto a polyester film from DuPont, type Mylar 300 J 102 having a width of 300 mm, which was unwound from a reel, in a coating unit from Kleinewefers with a drying tunnel from Monfords. The viscosity of the formulation was 40 dPas. The air doctor knife was set at a height such that the primer formulation could be applied in a wet-film thickness of 30 µm. The belt speed was 1.5 m/min. After a section of 2 m in open air, a 6-section drying tunnel was entered. The temperature was set at 130° C. in sections 1 and 2, and at 150° C. in sections 3 to 6. The coated and dried film was rolled up again and conditioned in the rolled-up state at 150° C. for 1 hour in a convection oven. The dry-film thickness was 6 µm.

Chemical metallization was conducted continuously while unwinding the conditioned film in PRINTOGANTH ML, a Cu bath from Atotech. Bath parameters: Cu 1.5 g/l, formaldehyde 10.0 g/l, NaOH 4.5 g/l, temperature 60° C. The rate of passage through this copper bath was set so as to give a residence time of 12 minutes. A Cu coat of 0.5 µm in thickness was obtained.

Coppering was continued in a second metallizing stage, likewise continuously, but now galvanically, with the existing copper coat being contacted with electric current. The copper bath employed was CUPRACIT BL from Atotech. In a first segment of the galvanic coppering, the process was conducted at a current density of 0.5 A/dm² (residence time: 10 min.) and, in a second segment, at a current density of 1.5 A/dm² (residence time: 8 min.). The film was subsequently rinsed with water and dried and the metallized film was rolled up again. The thickness of the copper coat was 3 µm.

The adhesive strength of the deposited copper coat was excellent; it was not possible to damage it or peel it off in the tape test. Following further galvanic reinforcement to a copper coat thickness of 35 µm, the peeling test in accordance with DIN 53 494 was carried out. Adhesive strength values of between 1.5 and 2 N/mm were found.

Example 2

A 40% strength solution of an aromatic polyamideimide was prepared from 4,4'-diphenylmethane diisocyanate and trimellitic anhydride in N-methyl-pyrrolidone. 250 parts by weight of this 40% strength solution of the polyamideimide, 90 parts by weight of methoxypropyl acetate, 2 parts by weight of 3-hepten-2-one-palladium dichloride and 15 parts by weight of AEROSIL® colloidal silica (200 m²/g by BET) were carefully mixed with one another on a triple roll mill. This primer formulation was printed over the entire area of a polyimide film from DuPont, type KAPTON VB 300, having a width of 300 mm, which was unwound from a reel, in a continuous screen-printing unit from Klemm. The printed wet coat was about 6 µm thick. After drying in a drying tunnel at an air temperature of 190° C., the printed film was rolled up again. The dry-film thickness was 1 µm.

Conditioning was carried out by passing the film over a heated roller (contact drying) whose surface had a temperature of 375° C. The rate of passage was set so as to give a residence time of the film on the roller of 2 minutes.

After conditioning by contact drying, chemical metallization was carried out continuously in a copper bath from MacDermid bearing the designation XD-6157-T. Bath parameters: Cu 2.0 g/l, formaldehyde 2.0 g/l, NaOH 3.0 g/l, temperature 70° C.

The rate of passage was set to give a residence time of 10 minutes. Coppering was continued in a second metallization stage, likewise continuously, but now galvanically, with the existing copper coat being contacted with electric current. The copper bath employed was LP 1 from Blasberg-Oberflächentechnik. In a first segment of the galvanic coppering, the operation was conducted at a current density of 0.5 A/dm² (residence time: 10 minutes) and, in a second segment, at a current density of 1.5 A/dm² (residence time: 8 minutes). The film was subsequently rinsed with water and dried and the metallized film was rolled up again. The thickness of the copper coat was 2.3 µm.

The adhesive strength of the deposited copper coat was excellent; it was not possible to damage it or to peel it off in the tape test. Following further galvanic reinforcement to a copper coat thickness of 35 µm, the peeling test according to DIN 53 494 was carried out. Adhesive strength values of between 1.5 and 2 N/mm were found. After a treatment in a solder bath at 288° C. for 20 seconds, it was found in the peeling test that there had been no decrease in the adhesive strength of the copper coat.

Example 3

The procedure of Example 2 was repeated exactly with the sole difference that the metallizable primer was applied not by screen printing but on a curtain-coating machine. For this purpose, the formulation indicated in Example 2 was adjusted by dilution with N-methylpyrrolidone to a solids content of 9% and a viscosity of 40 mPa.s. The wet-film thickness after curtain coating was about 55 µm, and the dry-film thickness after drying and conditioning was 5 µm. The results found for the metallized films were just as good as those indicated in Example 2.

What is claimed is:

1. A continuous process for producing a metal-coated film from a non-conducting film, by successive electroless and galvanic metallizations, which comprises subjecting the non-conducting film in a continuous roll-to-roll process to the following operations:

a) applying a metallizable primer,
b) drying the applied primer,
c) conditioning the applied primer,
d) optionally activating the applied primer,
e) treatment with an electroless chemical metallizing bath,
f) optional rinsing,
g) treatment with a galvanic metallizing bath,
h) rinsing, and
i) optional heat treatment of the metallized film, wherein the roll-to-roll process is interrupted after operation b), operation f) or both, and is later completed, beginning with operation c) or g), respectively, on a separate unit with rolls of film finished up to operation b) or up to operation f), respectively.

* * * * *